United States Patent Office 3,340,599

Patented Sept. 12, 1967

3,340,599

SIMPLE METHOD OF MAKING PHOTOVOLTAIC JUNCTIONS

James E. Webb, Administrator of the National Aeronautics and Space Administration, with respect to an invention of Sidney G. Ellis, Princeton, N.J.

No Drawing. Filed Mar. 8, 1965, Ser. No. 438,135
6 Claims. (Cl. 29—572)

ABSTRACT OF THE DISCLOSURE

This invention relates to an improved method for preparing gallium arsenide solar cells by the deposition of an inversion layer at its surface. The method can be performed at relatively low temperature and is simple to control. Briefly, the invention comprises the steps of depositing a relatively thin, transparent, conductive layer of cuprous iodide on a relatively thin n-type polycrystalline layer previously deposited on a conducting substrate, and heating the cuprous iodide layer with iodine vapor to lower its resistance.

*Origin of invention*

The invention described herein was made in the performance of work under a NASA contract and is subject to the provision of Section 305 of the National Aeronautics and Space Act of 1958, Public Law 85-568 (72 Stat. 435; 42 USC 2457).

A photovoltaic cell generates a voltage directly as a result of the absorption of a photon. Typical junctions for the photovoltaic cells are selenium-iron, copper oxide-copper. The photovoltaic cell consists of a an n-p junction between two different semiconductors, an n-type material in which conduction is due to electrons, and a p-type material in which conduction is due to positive holes. When light is absorbed near such a junction, new mobile electrons and holes are released. An additional feature of a photovoltaic cell, however, is that there is an electric field in the junction region between the two semiconductor types. The released charge moves in this field. This current will then flow in an external circuit. If the external circuits are broken, an open circuit photovoltage appears at the break.

The solar cell is a particular class of photovoltaic cell and may be considered as a constant current generator, the constant current being equal to that obtained on short circuit. This generator is shunted by the p-n junction, acting as a diode rectifier, and the load resistance. In addition, there are both shunt and series resistance elements present in the solar cell.

The most common solar cell produced heretofore is the silicon photovoltaic cell. Pure silicon can be made n-type by appropriate doping. By exposure to a boron containing vapor at high temperature the surfaces of the silicon is transformed to a p-type semiconductor. This type has a low electron density but a high hole density, so that the current is a migration holes, or positively charged sites, through the material. The region between the p- and n-type silicon is called the barrier region, and the whole structure is called a p-n junction.

Exposure of the treated surface to light produces light absorption within a layer about 0.0010 centimeter thick. Each light photon absorbed displaces an electron, producing both a free electron and an electron vacancy or hole. Since the original surface had a low electron density compared to the hole density, the effect of this photon absorption is to increase the electron density while increasing the hole density to a much lower extent.

A portion of the excess electrons will have sufficient energy to move through the barrier region into the n-type semiconductor region, where they are free to move into an external circuit and thus deliver power to a load.

In an effort to provide greater efficiencies and higher power outputs, many material and methods of manufacture have been investigated as they may relate to solar cells. For example, various gallium-arsenide structures have been investigated.

Gallium arsenide solar cells, using single crystal gallium arsenide, have been fabricated heretofore, by diffusing zinc into an n-type gallium arsenide layer with close control of time and temperature followed by an exacting etching process to bring the free surface of the cell close to the junction. The junction-to-surface distance is critical in this method and is of the order of one-half micron. Heterojunction cells, while far less critical in the thickness of the wide band-gap material, require high-temperature processing and presents other serious difficulties in preparation.

The areas of single crystal gallium arsenide cells are limited to about 1 centimeter by 2 centimeters at present, and it becomes expensive to construct a large area cell by assembling many small single crystal cells. If on the other hand one makes a large area polycrystalline n-type gallium arsenide film and attempts to form a surface junction by zinc diffusion then the rapid zinc diffusion down the crystal boundaries short circuits the p-type layer to the substrate holding the film. The present invention discloses a *low-temperature* method of forming a barrier which avoids this difficulty.

It has been known for a long time that the surface potential of a semiconductor is influenced by the chemical phase or phases with which the semiconductor is in contact. Under some conditions, the semiconductor may have an inversion layer at its surface; that is, the surface has the opposite conductivity type to the bulk. Given the right combination of properties, a chemical phase (preferably solid) formed on a semiconductor can produce a photovoltaic junction. The first of these properties is that a strong inversion layer should be produced in the semiconductor. The added phase should make an ohmic contact to the inversion layer. Also, the added layer should have high transmission for the radiation which will excite the semiconductor. Finally, the added layer should have low lateral resistance. There are, of course, other desirable properties which the added layer should have. For example, these may include ease of application, and chemical and electrical stability. The firstmentioned characteristics are, however, essential.

The present invention provides a novel method for the fabrication of a photovoltaic semiconductor having improved properties over similar devices made heretofore. In a preferred embodiment this comprises a large-area solar cell having a transparent conducting layer of cuprous iodide on a polycrystalline layer of n-type gallium-arsenide. The combination forms a barrier having improved performance as well as good rectifying properties. Other characteristics will be discussed hereinafter.

Accordingly, it is a principal object of this invention to provide direct contact to a polycrystalline layer of gallium arsenide and more particularly a cuprous-iodide contact to n-type gallium arsenide.

A further object of this invention is to provide a novel method for forming a rectifying and photovoltaic barrier with an n-type gallium arsenide.

Another object of the invention is to provide a novel and improved method of forming a p-type inversion layer on an n-type semiconductor.

Yet another object of the invention is to provide a solar cell of novel and improved characteristics comprising a layer of p-type cuprous iodide on a crystal of a n-type gallium arsenide.

It is still a further object of the invention to provide a novel and improved gallium arsenide semiconductor device.

It is a general object of this invention to provide novel and improved methods of fabricating photovoltaic devices which overcome disadvantages of previous means and methods heretofore intended to accomplish generally similar purposes.

Many other advantages, features, and additional objects of the present invention will become manifest to those versed in the art upon making reference to the detailed description which follows:

The invention is based on a transparent conducting layer of cuprous iodide (CuI), which is a p-type semiconductor, on an n-type gallium arenside (GaAs) polycrystalline layer. The combination forms a barrier with good rectifying properties. The junction between the CuI and the GaAs is referred to as a "barrier" rather than a "heterojunction" since it comprises a rectifying structure resulting from the contact of two dissimilar chemical phases. Heterojunctions, which are characteristic of prior art devices, comprise a special form of "barrier" where the junction exists at, or on both sides, or the chemical interface.

Briefly the method of making a large area cell consists of the following steps:

(1) Deposit a large area n-type polycrystalline layer 4 mils thick on a conducting substrate and making ohmic contact to it by techniques well known in the art.

(2) Clean the upper surface of this layer and deposit on it a layer of cuprous iodide by methods described below.

(3) Make ohmic contact to the cuprous iodide by evaporating on a gold grid.

(4) Heat the cuprous iodide layer with iodine vapor to lower its resistance.

The same procedures can be applied to single crystal gallium arsenide.

To better understand the present invention, a detailed description of a specific example will now be given.

EXAMPLE I

A wafer of gallium arsenide of polycrystalline formation was prepared having a thickness of about 20 mils and an area about 130 mils square. The material exhibited n-type conductivity. The wafer was placed in a suitable vacuum evaporating apparatus, and by conventional vacuum deposition process, a thin film of copper is evaporated onto one surface of the gallium arsenide wafer. The copper layer is subsequently exposed to iodine vapor at 70° C. for two minutes and then a gold grid is evaporated onto the exposed surface to give ohmic contact to the CuI. The device as prepared in the foregoing Example I was tested, and exhibited $V_{oc}=0.82$, $I_{sc}=20$ ma. under a focused microscope light.

The gallium arsenide should be a n-type with carrier concentration in the range of $10^{16}$ to $10^{17}$ centimeters.

The cuprous iodide layer can be formed by various techniques. These include: (1) evaporating copper onto the gallium arsenide and exposing it to iodine vapor at 70° centigrade (2) electroplating copper onto gallium arsenide and exposing it to iodine vapor at 70° centigrade (3) evaporating CuI onto the gallium arsenide.

EXAMPLE II

The gallium arsenide is cut into sheets with parallel surfaces and the upper side is used for the cuprous iodide deposition. The following etching procedure is then followed:

(1) Etch in a solution comprising 5 parts $H_2SO_4$, 1 part $H_2O_2$, 1 part $H_2O$ (all full strength) until the worked surface is removed. and the crystal is smooth. Water wash and dry.

(2) Etch in 1% bromine in methyl alcohol for 20 seconds with some agitation. Alcohol wash and dry.

(3) Wash in hydrofluoric acid for 30 seconds water wash and transfer wet to copper plating solution.

(4) Electroplate copper layer onto GaAs sheet.

(5) Expose copper layer to iodine vapor at 70° C. for 2 minutes.

(6) Apply electrode for ohmic contact to CuI layer as in Example I.

EXAMPLE III

This example involves the use of a GaAs sheet prepared as in Example II. In this example, however, the remaining method of applying the CuI layer is used. The third method of forming cuprous iodide layer is the direct evaporation of cuprous iodide to a thickness between 3 and 4 microns. The device is subsequently exposed to iodine vapor at 70° centigrade for 2 minutes after which a gold grid is evaporated on the surface to give ohmic contact to cuprous iodide, as indicated in the previous examples. It is once again given a 2 minute exposure to iodine vapor at 70° C. and is allowed to age in dry air for 2 days.

The pre-treatments described in the foregoing examples are designed to minimize the amount of oxide left on the GaAs crystal prior to the Cu deposition.

The value of $I_{sc}$ depends not only on the pre-treatment of the GaAs, but also on the optical transmission and sheet resistance of the CuI layer. These depend on more than the thickness of the CuI layer.

The value of $V_{oc}$ obtained with a CuI-GaAs barrier depends on the chemical history of the GaAs crystal up to the time at which the CuI or Cu is deposited on it. The electrodeposition method is the fastest one for producing an experimental cell. However, the preferred method of forming the CuI layer has been by direct evaporation of CuI to a thickness between 3 and 4 microns. The advantages of the method are that it can be done at low temperatures (i.e., not above 70° C. and it is relatively simple to control. Also, because it can be done by vacuum evaporation, it can be used to produce solar cells of special shapes for such applications as direction sensing and pattern recognition.

Although the invention has been described in terms of specific preferred embodiments, nevertheless, it will be appreciated that various changes and modifications will occur to those skilled in the art which do not in fact depart from the teachings in the present invention. Such changes are deemed to be within the spirit and scope of the invention as defined by the appended claims.

What is claimed is:

1. The method of making a photovoltaic junction comprising the steps of:
   forming an n-type gallium arsenide layer on a metal substrate; and
   depositing a film of p-type cuprous iodide on the exposed surface of said layer.

2. The method of making a photovoltaic cell comprising the steps of:
   mounting a layer of polycrystalline gallium arsenide on a metal substrate;
   forming an inversion layer by depositing cuprous iodide on said gallium arsenide layer; and
   applying an ohmic contact to said inversion layer.

3. The method of forming a barrier solar cell comprising the steps of:
   depositing a polycrystalline film of n-type gallium arsenide, having grain boundaries, onto a metal substrate;
   depositing a transparent film of cuprous iodide on said gallium arsenide layer; and
   attaching an ohmic contact to said cuprous iodide film.

4. The method of making a photovoltaic device comprising the steps of:
   forming a polycrystalline n-type gallium arsenide layer on a metal substrate;

evaporating cuprous iodide onto said gallium-arsenide layer to a thickness between approximately 3 to 4 microns; and attaching an ohmic contact to said cuprous iodide layer.

5. The method of forming a photovoltaic cell comprising the steps of:

forming a sheet from a galium arsenide crystal so as to have parallel surfaces;

etching said sheet until the worked surface is removed and the crystal is smooth;

washing said etched surface to remove the etchant and to minimize the amount of oxide on said crystal;

depositing a layer of cuprous iodide onto said gallium arsenide layer to a thickness between 3 and 4 microns;

applying a gold grid to said cuprous iodide layer to give ohmic contact thereto;

exposing said cuprous iodide layer to iodine vapor; and air-drying said cell for approxmiately 48 hours.

6. The method of making a photovoltaic junction comprising the steps of:

cutting an n-type gallium arsenide crystal so as to have a pair of substantially parallel surfaces;

etching said parallel surfaces to remove the worked surface and leave the crystal smooth;

washing said etched surfaces to remove the etchant;

electroplating said washed surfaces with a thin layer of copper;

exposing at least one of said copper-plated surfaces to iodine vapor at approximately 70° C. to form a cuprous iodide inversion layer;

evaporating a gold grid onto said cuprous iodide layer to give ohmic contact thereto; and re-exposing said cuprous iodide layer to iodine vapor at 70° centigrade.

References Cited

UNITED STATES PATENTS

| | | | |
|---|---|---|---|
| 2,756,165 | 7/1956 | Lyon | 117—211 |
| 2,766,144 | 10/1956 | Lidow | 117—200 |
| 3,114,088 | 12/1963 | Abercrombie | 317—237 |
| 3,264,707 | 8/1966 | Elie | 29—155.5 |

WILLIAM I. BROOKS, *Primary Examiner.*